Aug. 2, 1966 V. F. DAHLGREN ETAL 3,264,524

BONDING OF PRINTED CIRCUIT COMPONENTS AND THE LIKE

Filed May 17, 1963

INVENTORS:
VICTOR F. DAHLGREN
SIDNEY K. TALLY
THOMAS H. STEARNS
BY
Brumbaugh, Free, Graves & Donohue
THEIR ATTORNEYS United States Patent Office 3,264,524

Patented August 2, 1966

3,264,524

BONDING OF PRINTED CIRCUIT COMPONENTS AND THE LIKE

Victor F. Dahlgren, Chelmsford, Mass., and Sidney K. Tally, Nashua, and Thomas H. Stearns, Lyndeborough, N.H., assignors to Electro-Mechanisms, Inc., Methuen, Mass., a corporation of New Hampshire Filed May 17, 1963, Ser. No. 281,273

10 Claims. (Cl. 317—101)

This invention relates to improvements in electric circuitry, and more particularly to methods of making electrical connections in printed circuits, stacked printed circuits or modules, and to the resulting products.

Commonly, connections are made between conductors either by force fit contacts or by soldering. With the development of printed circuits, and particularly stacked printed circuits or modules composed of a plurality of layers of printed circuits carried by thin or flexible insulating films, the making of the electrical connections between the stacked or superimposed circuits has presented many difficult problems. It has been found that force fit connections are wholly unsatisfactory for the reason that corrosion, expansion and contraction of the circuits and the connectors causes either a change of electrical resistance or a complete loss of electrical contact in the circuit, thereby either altering the characteristics of the circuit unpredictably or rendering it useless.

In making soldered connections in such stacked circuits or modules, it has been necessary to make the connections around the periphery or perimeter of the modules where the conductors of the circuits are exposed. No practical method of soldering connections with the certainty and uniformity required has been provided heretofore when the connections must be made within the perimeter of the module. Attempts have been made to produce such internal connections by soldering the connections as the stack or module is assembled. However, this procedure is time-consuming and haphazard with many failures and rejects for the reason that the heat required for soldering one connection may and frequently does loosen a previously soldered connection.

A factor which has been considered limiting heretofore is the relation of the melting point of the solder to the effect of heat on the insulating film or base which carries the circuit elements. Inasmuch as many of the insulating films have relatively low melting or charring points, the solders which have been used heretofore have flow points lower than the temperature at which the insulating material is damaged. Such solders require the use of fluxes for making sound joints, and proper and uniform fluxing has not been possible when making internal connections in stacked circuits or circuit modules.

One proposal for the making of connections between superimposed circuits involves the forming of holes through a plurality of superimposed circuit assemblies and forcing a solder coated or solder carrying tube through the holes into contact with selected conductors. The tubes are heated by means of a hot plate or similar heating element to melt the solder and solder the tube or tubes to the various circuit elements with which the tubes are in contact. The solder on or in the tubes has a very low melting point and flow point, e.g., 200° F. to 350° F. and thereby renders the process impractical for the reason that electrical components to be attached to the hollow tubes cannot be soldered thereto without melting the solder which is used for making the circuit connections. As a result, open circuits are created by remelting of the solder, and contraction and expansion of the elements will produce other open circuits. Another unfavorable aspect of the method described is that, even if connections could be made with such low temperature solders, the resulting products would be useless for many purposes where temperatures on the order of 200° F. and higher are encountered.

The difficulties encountered heretofore in the making of electrical connections in circuits of the type described above are overcome in accordance with the present invention by means of a diffusion bonding or brazing technique making use of brazing metals such as silver brazing alloys and the like having melting points of 800° F. and higher.

More particularly, in accordance with the present invention, internal connections can be made in stacked printed circuits or in single printed circuits by forming holes at appropriate points through or adjacent and in contact with elements of the circuits and inserting into the holes connector elements provided with surface coatings or layers of a brazing alloy having a melting point of at least 800° F. and preferably much higher. Such brazing alloys have the ability to make a strong brazed union between clean elements without the need for fluxes. The connectors are heated, by means of welding apparatus having electrodes in contact with the opposite ends of the connectors, to a temperature such that brazing alloy melts in a fraction of a second and bonds the connector to any bare exposed metal immediately adjacent thereto or in contact therewith and without material damage to or alteration of the insulating medium upon which or in which the conductors are supported. In fact, it has been discovered that polyurethane plastics, which may be suitably used as an insulating base or as a component of an insulating base on which the printed circuits are supported serve as a flux and thus facilitate the flow of the brazing metal along the circuit element from the connector to form mechanically strong, electrically conducting fillets.

Due to the high melting point of the brazing alloy, connections external to the module, such as for example the attachment of circuit components to the projecting ends of the connectors, can be made by ordinary soldering operations using high temperature solder or the like so that the finished product can be used at temperatures well above those heretofore deemed possible without danger of loosening of the connections and breaking or modifying the characteristics of the circuit. Thus complex modules or stacked printed circuits to be used in space technology can be made which are resistant to temperatures considerably higher than earlier modules were capable of withstanding. Expansion and contraction due to temperature change has no effect on the brazed connections and circuits of almost unlimited life and capable of withstanding the most severe operating conditions can be produced by the method of the present invention.

For a better understanding of the present invention, reference may be had to the accompanying drawings, in which FIGURE 1 is an exploded view of a part of a stacked printed circuit or module showing four printed circuits arranged in position for assembly;

Figure 1:
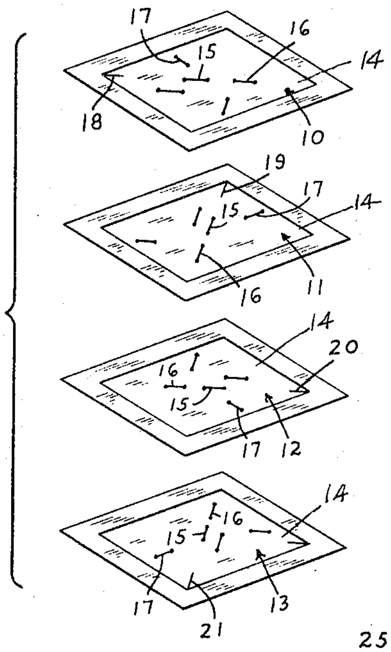
Figure 2:
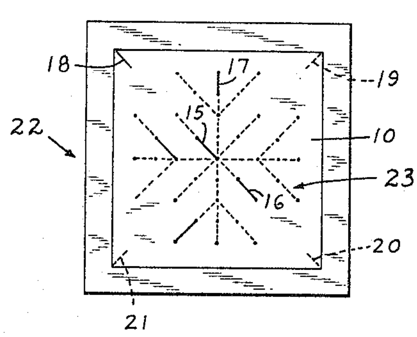
FIGURE 2 is a plan view of a typical stacked printed circuit or module composed of eight of the individual printed circuits shown in FIGURE 1.
Figure 3:
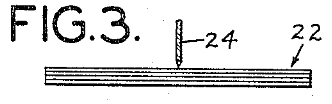
FIGURE 3 is a schematic illustration of the step of drilling a module of the type shown in FIGURE 2.
Figure 4:
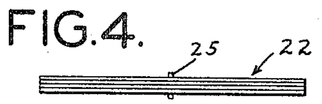
FIGURE 4 is a schematic illustration of a module in which has been inserted a connector pin of the type embodying the present invention.

Referring now to FIGURE 1, a typical stacked circuit or module may be composed of a series of printed circuits 10, 11, 12, 13, etc. which include an insulating sheet 14 formed of a plastic, or a fiberglass sheet impregnated or coated with an insulating plastic and a plurality of conductive elements 15, 16, 17, etc. formed of conductive metal, such as for example copper, which may be applied to the insulating base in any of the known ways, such as for example by electro-deposition, by etching through a resist or the like. As illustrated, the printed circuits 10, 11, 12 and 13 are the same, but are oriented with respect to each other as indicated by the register marks 18, 19, 20 and 21 thereon so as to provide a pattern of the conductors 15 to 17, etc. suitable for a required circuit. With the individual printed circuits in register, they can be laminated together by means of heat and pressure to produce a module 22, such as that shown in FIGURE 2 having a circuit pattern 23. Any other desired arrangement of the conducting portions of the printed and stacked circuits can be provided, in accordance with requirements. The module shown in FIGURE 2 actually is composed of eight printed circuits of the type of the circuits 10 to 13 and thus provides the circuit pattern 23 in which portions of the circuits are superimposed and are to be connected with each other.

In accordance with the present invention, in order to connect, for example, the midpoint or any other points of intersection of the circuit 23 of the module 22, one or more holes are drilled completely through the module at the desired connection points. These holes may be drilled by means of wire drills 24 or any other suitable way and as many holes are drilled in the module as may be required for making the necessary connections between the superimposed printed circuits.

Figure 6:
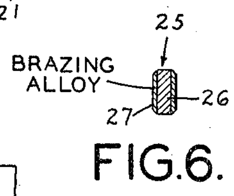
FIGURE 6 is a view in cross-section of a typical connector pin used for practicing the invention.

In each of the holes in the modules, a connector pin 25 is inserted. As shown in FIGURE 6, each connector pin is composed of a conductive member such as a copper or nickel tube, wire or rod 26, having a surface coating 27 of a brazing alloy such as a silver brazing alloy.

Typical brazing alloys are the following Handy & Harman silver brazing alloys:

| | Composition | Melting Point, ° F. | Flow Point, ° F. |
|---|---|---|---|
| Sil-Fos | 15% Ag, 80% Cu, 5% P | 1,185 | 1,300 |
| 603 | 60% Ag, 30% Cu, 10% Sn | 1,115 | 1,325 |
| BT | 72% Ag, 28% Cu | 1,435 | 1,435 |
| Premabraze 615 | 61.5% Ag, 24% Cu, 14.5% In | 1,155 | 1,305 |

Other similar brazing alloys also are suitable.

Due to the high melting temperature and flow temperature of such silver brazing alloys, conventional heating means such as soldering irons, torches and the like cannot be used for raising the temperature of the pin 25 sufficiently to melt the brazing alloy without at the same time damaging the insulating portion of the module. Heating, in accordance with the present invention, is accomplished by means of an electric spot welder 28 having electrodes 29 and 30 which can be brought together and pressed against the opposite ends of the pin 25. Any spot welding apparatus can be used which enables the electrodes to be pressed against the ends of the pin 25 and includes a timing mechanism by means of which pulses of electricity of a desired duration can be applied to the weld zone.

Figure 7:
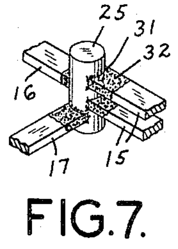
FIGURE 7 is a perspective view of a typical joint between a connector pin and conductors of the module, shown greatly enlarged, with the insulation removed therefrom.

Satisfactory results are obtained with a 3 kva. spot welder manufactured by Eisler Engineering Co., Inc. of Newark, New Jersey, and identified as model 93V3. The welder, a 200 volt type, was modified for operation on 110 volts to provide 11 voltage taps providing, at the electrodes, voltages from about 1.05 volts to about 1.6 volts in approximately equal steps. In using such a welding apparatus with the pin 25, a pulse of only relatively few cycles of a 60 cycle A.C. current will melt and cause the brazing alloy 27 to flow and form a strong electrically conductive connection between the rod or wire 26 and the adjacent or engaging conductors 15, 16, 17, etc. of the several layers in the module 22 as represented in FIGURE 7 of the drawings. In typical connections, the brazing metal forms a fillet 31 at each joint which extends a substantial distance 32 along each of the conductors, thereby assuring a mechanically strong, temperature resistant and elecrically conductive connection between the conductors and the pin 26. In fact, the mechanical strength of the connections between the rod or wire 25 of the connector and the conductors 15, etc. is so great that the joint will not be broken even when the insulating medium is torn away from the connectors to expose them.

In a typical method, the printed circuits may have an insulating base formed of fiberglass impregnated with a suitable insulating resinous material, such as for example a polyurethane plastic sold by Conap, Inc. and disclosed in Conap, Inc. bulletin U–1500–1, and identified as 2000/AH–3. This resin is a two component resin requiring a four-hour cure at 100° C. When cured, the resin has a Shore A hardness of 80 and an elongation of 150%, a tensile strength of 1300, water absorption of 1.1% on twenty-four hour immersion, electrical dissipation factor at 25° C. of 0.08 and a dielectric constant of 4.6. It also has a Brookfield viscosity at 25° C. of 9000, and at 80° C. of 300. Another suitable polyurethane resin is Bonner No. 7021 manufactured by Bonner Chemicals Division of Bay State Chemical Co., Inc. The use of these resins and similar resins produces an insulating base of a desired thinness and durability as well as having other properties of a desired nature. Other suitable polyurethanes as well as such polyester resins as Mylar are useful as impregnating and coating medium for the insulating base 14.

A typical connector pin 25 has a copper core 26 of a diameter of .027 inch and a brazing alloy jacket 27 .003 of an inch thick formed of a brazing alloy such as the Handy & Harman brazing alloys described above. The jacket may extend over the ends of the core 26 but preferably terminates short of the ends to prevent the alloy from flowing onto the electrodes.

Figure 5:
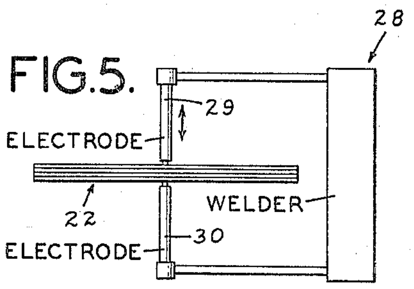
FIGURE 5 is a schematic illustration of the step of brazing the connector pin to components of the module.

In brazing the pin 25 to the circuit conductors of the module 22 as illustrated in FIGURE 5, the spot welding apparatus is provided with tungsten electrodes 1/16 of an inch in diameter. Five pound pressure was applied to the opposite ends of the pin 25 by means of the electrodes 29 and 30 and brazing was accomplished supplying welding current to the pin 25 for 1/5 of a second, i.e., 12 cycles, at a No. 11 tap (1.6 volts). Brazing was evidenced by almost instantaneous heating of the pin and a slight puff of smoke or vapor caused by vaporization of the plastic immediately adjacent the connector.

Nevertheless, the continuity of the insulating material was not appreciably altered and no charring occurred. While the brazing conditions indicated are optimum, other combinations of voltage and time cycles of the welder may be required with pins 25 having different brazing alloys thereon and with larger or smaller pins in order to assure heating of the connectors to melt and bond the brazing metal 27 to the conductors of the module 22.

Figure 8:
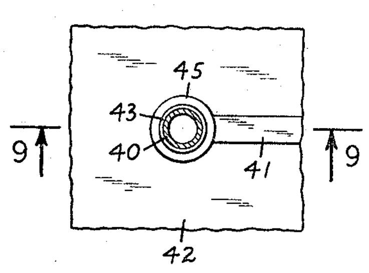
FIGURE 8 is a top plan view illustrating another type of connection between a connector element and components of a printed circuit according to the present invention.
Figure 9:
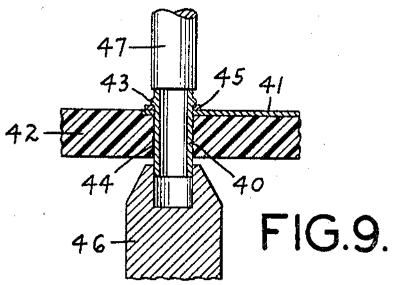
FIGURE 9 is a view in cross-section taken on the line 9—9 of FIGURE 8.

A similar method can be used for making brazed connections in single layer printed circuits and other types of connectors can be used if desired. Thus, for example, referring to FIGURES 8 and 9, a tubular connector or eyelet 40 is used for connecting an electrical component to a conductor 41 on an insulating base 42 formed of or coated with a suitable resin such as Bonner No. 7021. The eyelet 40 is provided with a shoulder 43 and is inserted through a hole 44 suitably formed through the base 42 of the conductor 41 by drilling or in any other suitable way. Interposed between the shoulder 43 and the conductor 41 is a thin disk or strip 45 of a brazing alloy of the type described above. It is unnecessary to heat the eyelet 40 throughout its extent to melt the strip 45 and accordingly, the lower electrode 46 of the welding apparatus is formed of copper and is provided with a recess 47 which receives the end of the eyelet. The upper electrode 47 is formed of molybdenum, and in a typical example has an outside diameter of .050 inch or somewhat larger than the upper end of the eyelet 40. The molybdenum electrode 47 is heated by the passage of current therethrough and heats and melts the brazing alloy 45 by conduction through the eyelet 40. Typical copper eyelets have an outside diameter of .031 inch, a shoulder 43 diameter of .048 inch, and a central opening therethrough having a diameter of .020 inch. The brazing alloy 45 is of any of the types described above. With this arrangement, and with the welding apparatus set on No. 4 tap (1.2 volts) and a pressure of three and one-half pounds applied to the eyelet, effective brazing was accomplished with an electric impulse of five cycles (1/12 second) duration. It was found that brazing was improved by coating the base 42 with a polyurethane resin. However, other resinous impregnants or coatings gave good results and enabled brazing to be effected without being charred or otherwise damaged.

Figure 10:
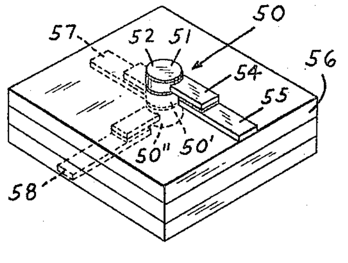
FIGURE 10 is a perspective view of a portion of a printed circuit illustrating a modified form of connector.

Still other types of connectors can be provided for connecting the components or conductors of stacked printed circuits, such as for example the form of connector shown in FIGURE 10. A connector 50 shown therein may consist of a small copper disk 51 having a diameter suitable for the purpose and on the order of a diameter of the rod 26 shown in FIGURE 6 and having on its opposite ends coatings 52 and 53 of silver brazing alloy. Projecting laterally from the disk 51 is an arm 54 which may be coated with a brazing alloy of the type referred to above or at least having on its undersurface a thin layer of such a brazing alloy. In making connections between the connector 50 and a conductor 55 on an insulating base 56, the base may be drilled to receive the disk 51 and the connector applied so that the arm 54 overlies the conductor 55. A series of circuits can be provided with connectors 50 in appropriate locations and, as illustrated in FIGURE 10, a column of connectors 50, 50′ and 50″ may be in end-to-end engaging relation to serve as a connection between the conductor 55 and conductors 57 and 58 on the superimposed printed circuits. When the top of the upper disk 51 is engaged by one electrode of the welding apparatus and the bottom of the lowermost connector 50″ is engaged by the lower electrode of the welding apparatus and pressure is applied, the connectors 50, 50′ and 50″ are brought into engagement. Upon passage of welding current therethrough, the brazing metal on their ends is melted causing them to unite mechanically and electrically and at the same time the brazing alloy on the arms 54 is melted to braze the arms 54 to the conductors 55, 57 and 58 and thereby produce a mechanically strong and electrically conductive connection between the various conductors. Variations can, of course, be made in the shape and dimensions of the buttons or disk 51 and the arms 54 thereon in order to adapt them to various circuits. Thus, for example, by using L-shaped arms on the disk 51, it is possible to make a connection between the connector 50 and a non-radially extending conductor 55, thereby giving great flexibility in making connections in circuits of various types.

Still other variations of the connectors may be made, for example, stranded connectors including strands of copper and silver brazing alloy, strands of copper having wrapping or winding of silver brazing alloy. Also, but less conveniently, the conductors on the printed circuit may be plated or otherwise provided with a layer of silver brazing alloy or layers of its alloy components which, upon heating, will form a brazed or diffusion bonded joint with a bare connector pin, eyelet, disk or the like. In all such connections, by the use of suitable types of brazing alloys and plastic insulating bases which vaporize rather than char, at the temperature of brazing, clean, strong connections are made and consistent results are obtained, so that few, if any, rejects occur even in the most complicated modules or stacked printed circuits.

The present invention thus enables the production of modules to which other components can readily be soldered even with high temperature solder or with brazing metals which are of lower temperature than those used directly on the connectors without interrupting or otherwise causing deterioration or damage to the connections previously made. In this way, components may be added to the circuit without the care and skill previously required when dealing with the conventional solders having lower melting points and the end products are of much greater durability and capable of withstanding high temperature operating conditions which would damage or destroy modules made by prior soldering techniques.

It will be understood that the components, such as the connectors, the welding techniques, and the materials used as insulating medium for supporting the circuits are susceptible to modification and accordingly, the examples of the invention given herein are to be considered as illustrative. The invention, therefore, is limited only as defined in the following claims.

We claim:

1. A method of connecting electrical conductors mounted on an insulating support including plastic material damaged by heat at temperatures less than 800° F. comprising forming a hole through said insulating support adjacent to a conductor thereon, inserting into said hole an electrically conductive connecting means having a coating of a brazing alloy having melting point of at least 800° F. in contact with said conductor, applying for a period of time of less than a second a welding current to the opposite ends of said connecting means at opposite sides of said support to heat said connecting means to a temperature higher than 800° F. and less than the melting point of said connecting means to melt said brazing alloy and braze said connecting means to said conductor without damaging said insulating support.

2. The method set forth in claim 1 in which said insulating support includes a polyurethane plastic which on heating to the flow point of said alloy fluxes the surface of said connector and said conductor.

3. A method of connecting electrical conductors comprising forming at least one hole through a stacked circuit assembly having a plurality of separate conductors therein separated by interposed layers of insulating material which is damaged by heat at temperatures less than 800° F., said hole passing through said assembly adjacent to selected portions of said conductors, inserting connecting means in said hole with a brazing alloy having a melting point of at least 800° F. interposed between and in contact with said connecting means and said selected portions of said conductors and applying a welding current for a period of time of less than a second to said connecting means with the electrodes of a welding apparatus engaging the outer ends of said connecting means on opposite sides of said assembly to heat said connecting means to a temperature higher than 800° F. and less than the melting point of said connecting means to melt said brazing alloy and braze said connecting means to said selected portions of said conductors.

4. The method set forth in claim 3 in which said connecting means is an electrical conductive member having a surface coating of a silver brazing alloy.

5. The method set forth in claim 3 in which said stacked circuit assembly is composed of a plurality of flexible printed circuits bonded together in superimposed relation, each of said printed circuits having a plurality of conductors.

6. A printed circuit member comprising an insulating support including an electrically insulating plastic material which is damaged by heat at temperatures less than 800° F. and having at least one electrical conductor encapsulated therein and at least one electrically conductive connector extending through said support in spaced relation to the perimeter thereof and united with a selected portion of said conductor by a brazing alloy having a melting point of at least 800° F.

7. The printed circuit member set forth in claim 6 comprising a plurality of printed circuits each having a plurality of conductors, said printed circuits being separated by insulating material and in superimposed relation, said connector uniting a plurality of selected conductors in said printed circuits.

8. The printed circuit member set forth in claim 6 in which the connector is tubular and has a peripheral shoulder at least partially united to said conductor by said brazing alloy.

9. The module set forth in claim 6 in which said insulating material includes a polyurethane plastic.

10. The module set forth in claim 6 in which said insulating material includes a thin, flexible sheet of glass fiber fabric having at least a surface coating of polyurethane plastic.

References Cited by the Examiner

UNITED STATES PATENTS

| | | | |
|---|---|---|---|
| 2,502,291 | 3/1950 | Taylor ____________ | 174—68.5 |
| 3,070,650 | 12/1962 | Stearns ____________ | 174—68.5 |
| 3,098,951 | 7/1963 | Ayer et al. _________ | 174—68.5 |
| 3,143,787 | 8/1964 | Babbe ____________ | 174—168.5 |
| 3,151,278 | 9/1964 | Elarde _____________ | 317—101 |

OTHER REFERENCES

Handy & Harman, Technical Bulletin 20, Easy-Flo and Sili-Fos, 24 pages (pp. 5, 16 and 18 relied on).

ROBERT K. SCHAEFER, *Primary Examiner.*

JOHN F. BURNS, KATHLEEN H. CLAFFY, *Examiners.*

J. G. COBB, J. J. BOSCO, *Assistant Examiners.*

UNITED STATES PATENT OFFICE
CERTIFICATE OF CORRECTION

Patent No. 3,264,524 August 2, 1966

Victor F. Dahlgren et al.

It is hereby certified that error appears in the above numbered patent requiring correction and that the said Letters Patent should read as corrected below.

Column 7, line 23 and column 8, line 1, strike out "module" and insert instead -- printed circuit member --.

Signed and sealed this 26th day of September 1967.

(SEAL)
Attest:

ERNEST W. SWIDER
Attesting Officer

EDWARD J. BRENNER
Commissioner of Patents